US009442701B1

(12) United States Patent
Aldrich

(10) Patent No.: US 9,442,701 B1
(45) Date of Patent: Sep. 13, 2016

(54) VERIFYING MODELS FOR EXCEPTIONAL BEHAVIOR

(75) Inventor: William J. Aldrich, Natick, MA (US)

(73) Assignee: The MathWorks, Inc., Natick, MA (US)

( * ) Notice: Subject to any disclaimer, the term of this patent is extended or adjusted under 35 U.S.C. 154(b) by 1390 days.

(21) Appl. No.: 12/143,308

(22) Filed: Jun. 20, 2008

Related U.S. Application Data

(60) Provisional application No. 60/945,406, filed on Jun. 21, 2007.

(51) Int. Cl.
  *G06F 9/44* (2006.01)
(52) U.S. Cl.
  CPC ..................... *G06F 8/34* (2013.01)
(58) Field of Classification Search
  None
  See application file for complete search history.

(56) References Cited

U.S. PATENT DOCUMENTS

| | | | |
|---|---|---|---|
| 4,914,568 A * | 4/1990 | Kodosky et al. ............. 715/763 |
| 5,475,851 A * | 12/1995 | Kodosky et al. ............. 715/763 |
| 5,821,934 A * | 10/1998 | Kodosky et al. ............. 715/763 |
| 5,987,246 A * | 11/1999 | Thomsen et al. ............. 717/109 |
| 6,124,869 A * | 9/2000 | Miller et al. .................... 345/544 |
| 6,405,145 B1 * | 6/2002 | Rust et al. ....................... 702/91 |
| 6,526,566 B1 * | 2/2003 | Austin ........................... 717/109 |
| 7,062,719 B2 * | 6/2006 | Zirojevic et al. ............. 715/771 |
| 7,185,315 B2 * | 2/2007 | Sharp et al. .................. 717/109 |
| 7,275,235 B2 * | 9/2007 | Molinari et al. .............. 717/100 |
| 7,483,825 B2 * | 1/2009 | Van Huben et al. ........... 703/16 |
| 7,640,154 B1 * | 12/2009 | Clune et al. .................... 703/22 |
| 7,680,632 B1 | 3/2010 | Aldrich |
| 7,913,225 B2 * | 3/2011 | Seemann et al. ............. 717/117 |
| 7,962,901 B2 * | 6/2011 | McCamant et al. .......... 717/131 |
| 7,974,825 B2 * | 7/2011 | Linebarger et al. ............ 703/13 |
| 8,015,542 B1 * | 9/2011 | Parthasarathy et al. ...... 717/105 |
| 2001/0024211 A1 * | 9/2001 | Kudukoli et al. ............. 345/763 |
| 2002/0066077 A1 * | 5/2002 | Leung ........................... 717/126 |
| 2002/0100022 A1 * | 7/2002 | Holzmann .................... 717/126 |
| 2003/0046657 A1 * | 3/2003 | White ........................... 717/105 |
| 2004/0153992 A1 * | 8/2004 | Molina-Moreno et al. .. 717/105 |
| 2004/0210592 A1 * | 10/2004 | Ciolfi et al. ................... 707/101 |
| 2004/0255296 A1 * | 12/2004 | Schmidt et al. .............. 718/100 |
| 2005/0022166 A1 * | 1/2005 | Wolff et al. ................... 717/124 |
| 2005/0160397 A1 * | 7/2005 | Szpak et al. .................. 717/104 |
| 2005/0187746 A1 * | 8/2005 | Hicklin et al. .................. 703/11 |
| 2005/0257184 A1 * | 11/2005 | Fujita ................................ 716/5 |
| 2005/0257194 A1 * | 11/2005 | Morrow et al. .............. 717/109 |
| 2005/0268173 A1 * | 12/2005 | Kudukoli et al. .............. 714/38 |

(Continued)

OTHER PUBLICATIONS

National Instruments. Labview Function and VI Reference Manual. Jan. 1998. Copyright 1997, 1998. Austin, Texas.*

(Continued)

*Primary Examiner* — Matthew Brophy
(74) *Attorney, Agent, or Firm* — Harrity & Harrity, LLP

(57) ABSTRACT

A computer-implemented method may include receiving a specification including one or more instances of a language construct, the language construct having an exceptional behavior; identifying in the specification the one or more instances of the language construct having the exceptional behavior; applying a modification to the one or more instances of the language construct having the exceptional behavior, the modification making the exceptional behavior explicit; analyzing the specification for dynamic occurrences of the explicit exceptional behavior; and generating information identifying the dynamic occurrences of the explicit exceptional behavior.

20 Claims, 11 Drawing Sheets

(56) References Cited

U.S. PATENT DOCUMENTS

| | | | |
|---|---|---|---|
| 2006/0036799 A1* | 2/2006 | Shah et al. | 711/100 |
| 2006/0064670 A1* | 3/2006 | Linebarger et al. | 717/106 |
| 2006/0130025 A1* | 6/2006 | Walpole | 717/141 |
| 2006/0136863 A1* | 6/2006 | Szpak | 717/104 |
| 2006/0150160 A1* | 7/2006 | Taft et al. | 717/126 |
| 2006/0277484 A1* | 12/2006 | Brockway | 715/764 |
| 2006/0288327 A1* | 12/2006 | Torgerson et al. | 717/105 |
| 2007/0016888 A1* | 1/2007 | Webb | 717/106 |
| 2007/0027652 A1* | 2/2007 | Hosagrahara | 702/182 |
| 2007/0157162 A1* | 7/2007 | Ciolfi | 717/105 |
| 2008/0066046 A1* | 3/2008 | Ogilvie et al. | 716/18 |
| 2009/0222774 A1* | 9/2009 | Grosse et al. | 716/5 |
| 2010/0251209 A1* | 9/2010 | Murthy | 717/104 |

OTHER PUBLICATIONS

Mathworks. Using Simulink. Reference Version 6. Jun. 2004. Natick, MA.*

William J. Aldrich, co-pending U.S. Appl. No. 11/096,528, filed Mar. 31, 2005, entitled "Test Precondition Items for Automated Analysis and Test Generation."

* cited by examiner

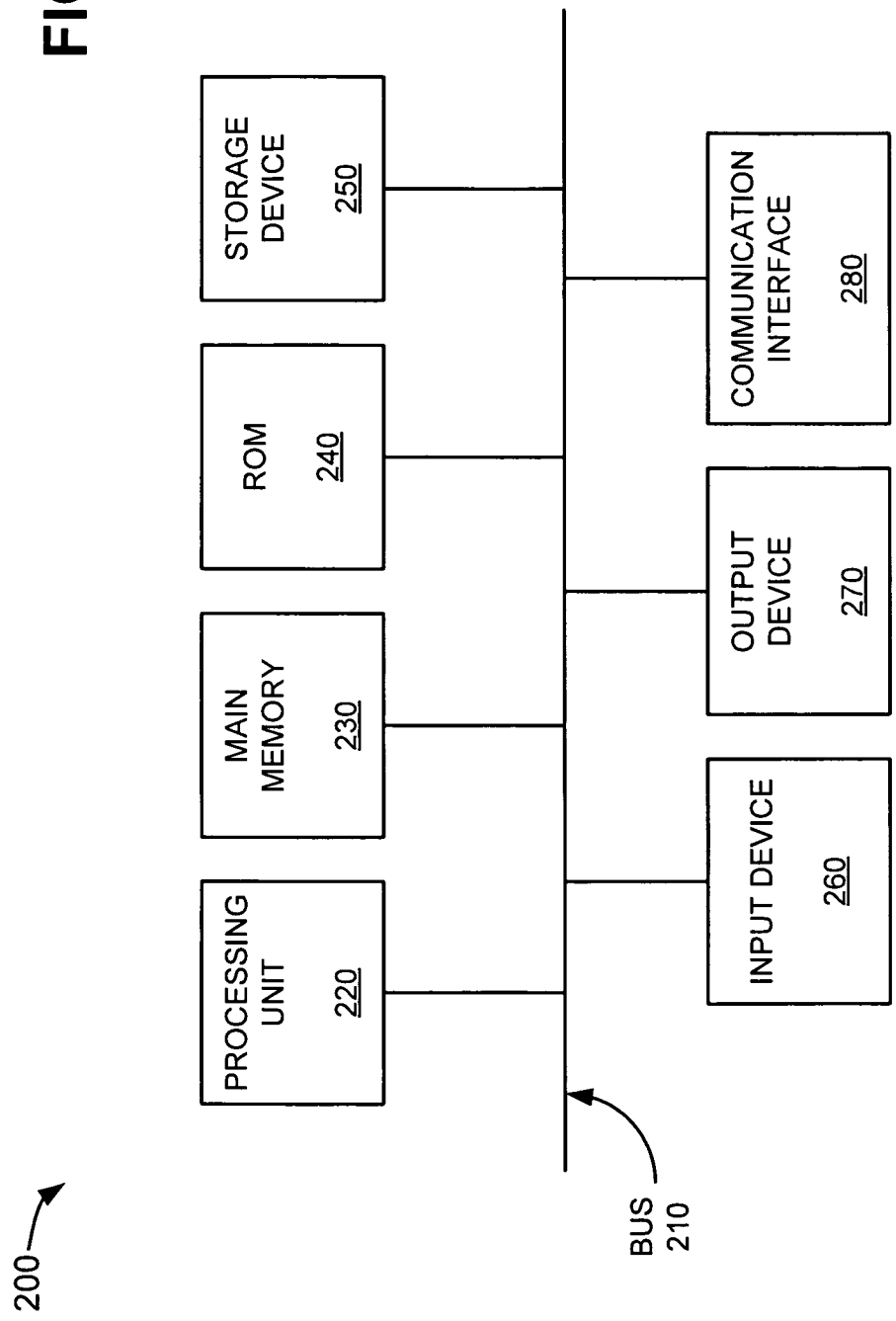

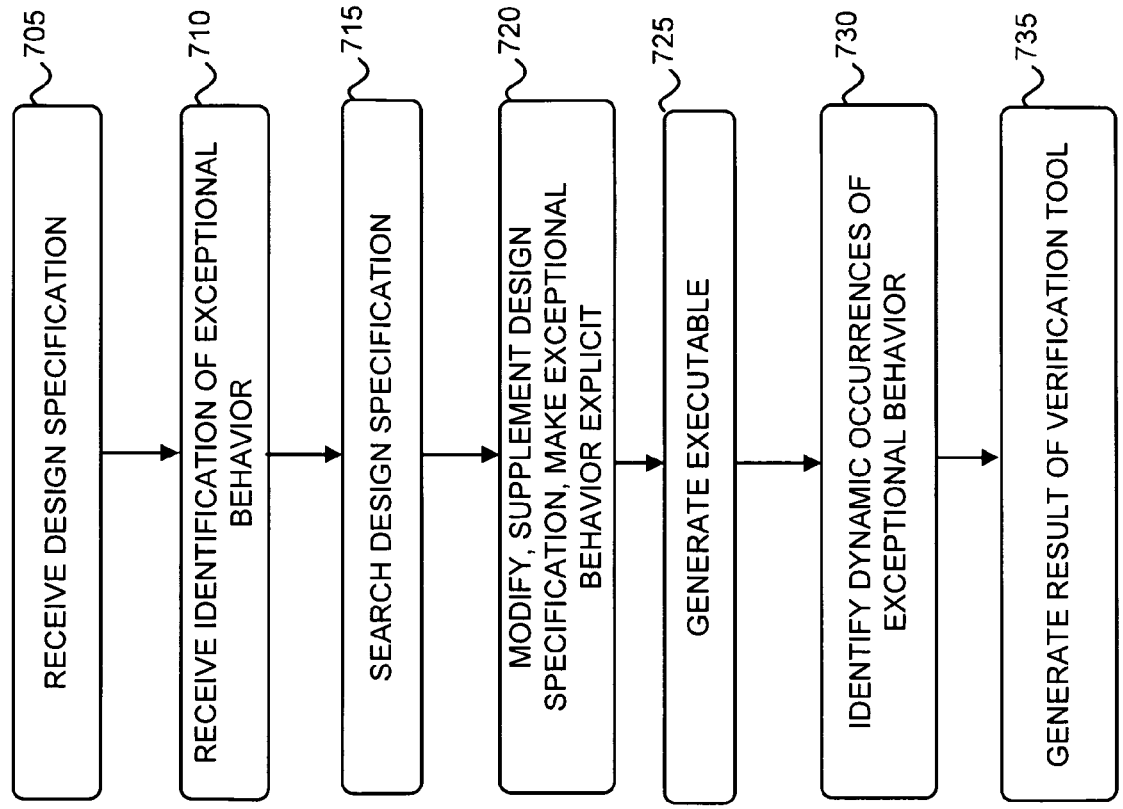

US 9,442,701 B1

VERIFYING MODELS FOR EXCEPTIONAL BEHAVIOR

RELATED APPLICATIONS

The instant patent application claims priority to Provisional Patent Application No. 60/945,406, filed Jun. 21, 2007, which is incorporated herein by reference.

BACKGROUND INFORMATION

Modeling and simulation may be used for designing hardware and/or software implementations of designs. Such models have become increasingly complex, however, making it increasingly more difficult to identify undesired behaviors in models during simulation. Verification tools can provide a comprehensive approach to testing and verifying, e.g., identifying undesired behaviors, in designs. The increasing complexity of models, however, also makes it very challenging for designers to use verification tools to comprehensively test designs for undesired behaviors.

BRIEF DESCRIPTION OF THE DRAWINGS

The accompanying drawings, which are incorporated in and constitute a part of this specification, illustrate one or more implementations described herein and, together with the description, explain these implementations. In the drawings:

FIG. 2 is a block diagram of an exemplary device corresponding to the workstations or servers of FIG. 1;

FIG. 7 is a flowchart of an exemplary process for making an exceptional behavior explicit in a model-based design and verifying the model-based design.

DETAILED DESCRIPTION

The following detailed description refers to the accompanying drawings. The same reference numbers in different drawings may identify the same or similar elements. Also, the following detailed description does not limit the invention.

Overview

Embodiments described herein may provide design elements in a model-based design (e.g., a graphical model-based design, a textual model-based design, or a hybrid model-based design that combines a graphical model-based design with a textual model-based design) to represent and identify exceptional behavior (e.g., undesirable behavior). Exemplary embodiments can use these identified exceptional behaviors for use in verifying the design of a model. For example, information about exceptional behaviors may be provided to a verification tool that is used to verify and/or validate the model design.

Exemplary Environment

Figure 1:
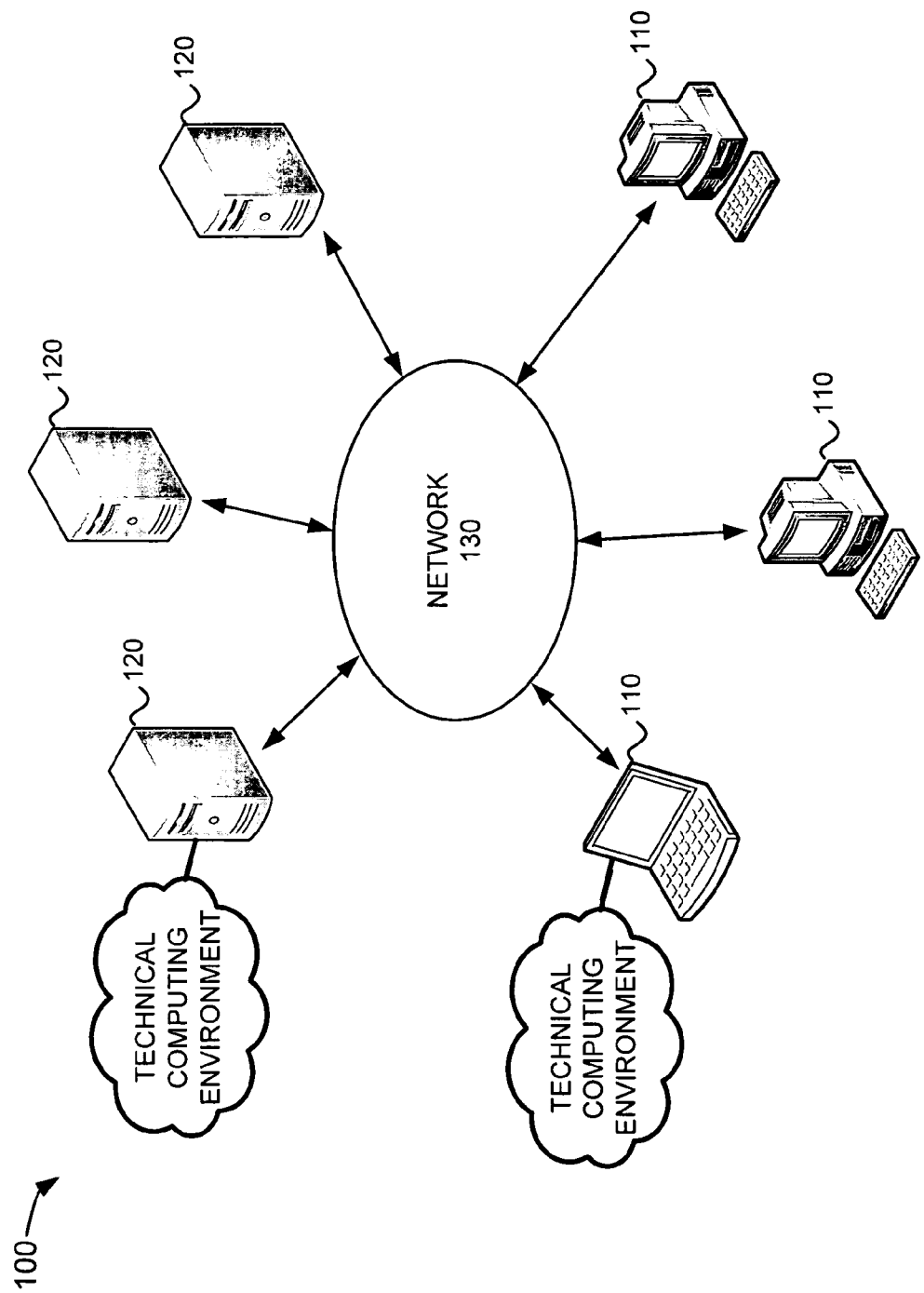
FIG. 1 is a block diagram of an exemplary system in which embodiments described herein may be implemented.

FIG. 1 is an exemplary diagram of a system 100 in which embodiments described herein may be implemented. System 100 may include one or more workstations 110, one or more servers 120, and a network 130. Workstations 110 and/or servers 120 may provide a technical computing environment (TCE) that includes a graphical modeling tool and/or a verification tool for modeling and verifying (e.g., testing) model-based designs. System 100 may include more, fewer, or a different arrangement of components than what is shown in FIG. 1.

Workstations 110 may each include a device, such as a computer or another type of computation or communication device, a thread or process running on one of these devices, and/or an object executable by one of these devices. The users of workstations 110 may use a graphical modeling tool to create model-based designs that may be verified using a verification tool, for example. In some implementations, as shown in FIG. 1, the graphical modeling tool and verification tool may include client-side (e.g., workstation 110) components and server-side components. In an alternative implementation, the graphical modeling tool and verification tool may execute exclusively in workstation 110. In this implementation, servers 120 may not be used.

Servers 120 may each include a device, such as a computer or another type of computation or communication device, a thread or process running on one of these devices, and/or an object executable by one of these devices or an instruction set simulator. Servers 120 may provide services to other devices (e.g., workstations 110) connected to network 130. In one embodiment, one or more of servers 120 may include server components of the verification tool.

Servers 120 may include multiple heterogeneous server platforms. Multiple heterogeneous server platforms may include a variety of server environments. For example, in one implementation, the multiple heterogeneous server platforms may include one or more of a Linux operating system, a Windows operating system, a Solaris operating system, a Macintosh operating system, a UNIX-based operating system, and/or a real-time operating system (RTOS). In an exemplary implementation, servers containing multiple heterogeneous server platforms may include processing logic, where the processing logic may be used to facilitate parallel or distributed processing.

Network 130 may include a wide-area network (WAN), the Internet, a local-area network (LAN) (either wired or wireless), a telephone network, an intranet, a private corporate network, or a combination of networks.

The TCE provided by workstations 110 and servers 120 may present a user with an interface that enables efficient analysis and generation of technical applications. For example, the TCE may provide a numerical and/or symbolic computing environment that allows for matrix manipulation, plotting of functions and data, implementation of algorithms, creation of user interfaces, and/or interfacing with programs in other languages.

The TCE may include any hardware, software, and/or a combination of hardware and software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In one implementation, the TCE may include a dynamically-typed programming language (e.g., the M language) that can be used to express problems and/or solutions in mathematical notations. For example, the TCE may use an array as a basic element, where the array may not require dimensioning. In addition, the TCE may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc. In one implementation, the TCE may include a code generator that generates code from a graphical-based model.

The TCE may further provide mathematical functions and/or graphical tools (e.g., for creating plots, surfaces, images, volumetric representations, etc.). In one implementation, the TCE may provide these functions and/or tools using toolboxes (e.g., toolboxes for signal processing, image processing, data plotting, parallel processing, etc.). In another implementation, the TCE may provide these functions as block sets. In still another implementation, the TCE may provide these functions in another way, such as via a library, etc.

The TCE may be implemented as a text-based environment (e.g., MATLAB® software; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; etc.), a graphically-based environment (e.g., Simulink® software, Stateflow® software, SimEvents™ software, etc., by The MathWorks, Inc.; VisSim by Visual Solutions; LabView® or SystemBuild® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; aspects of a Unified Modeling Language (UML) or SysML environment; etc.), or another type of environment, such as a hybrid environment that includes one or more of the above-referenced text-based environments and one or more of the above-referenced graphically-based environments.

Exemplary Device

FIG. 2 is a diagram of an exemplary device 200 corresponding to one of workstations 110 or servers 120. As illustrated, device 200 may include a bus 210, a processing unit 220, a main memory 230, a read-only memory (ROM) 240, a storage device 250, an input device 260, an output device 270, and/or a communication interface 280. Bus 210 may include a path that permits communication among the components of device 200.

Processing unit 220 may include a processor, microprocessor, or other types of processing logic that may interpret and execute instructions. Main memory 230 may include a random access memory (RAM) or another type of dynamic storage device that may store information and instructions for execution by processing unit 220. ROM 240 may include a ROM device or another type of static storage device that may store static information and/or instructions for use by processing unit 220. Storage device 250 may include a magnetic and/or optical recording medium and its corresponding drive.

Input device 260 may include a mechanism that permits an operator to input information to device 200, such as a keyboard, a mouse, a joystick, a pen, a microphone, a touch-sensitive display, voice recognition and/or biometric mechanisms, etc. Output device 270 may include a mechanism that outputs information to the operator, including a display (e.g., providing a graphical user interface (GUI)), a printer, a speaker, etc.

Communication interface 280 may include any transceiver-like mechanism that enables device 200 to communicate with other devices and/or systems. For example, communication interface 280 may include mechanisms for communicating with another device or system via a network. Communication interface 280 may include a built-in network adapter, network interface card, a wireless network adapter, a universal serial bus (USB) adapter, a modem, etc.

As will be described in detail below, device 200 may perform certain operations in response to processing unit 220 executing software instructions contained in a computer-readable medium, such as main memory 230. A computer-readable medium may be defined as a physical or logical memory device. The software instructions may be read into main memory 230 from another computer-readable medium, such as storage device 250, or from another device via communication interface 280. The software instructions contained in main memory 230 may cause processing unit 220 to perform processes that will be described later. Alternatively, hardwired circuitry or programmed circuitry (e.g., firmware) may be used in place of or in combination with software instructions to implement processes described herein. Thus, implementations described herein are not limited to any specific combination of hardwired circuitry, programmed circuitry, and software.

Although FIG. 2 shows exemplary components of device 200, in other implementations device 200 may contain fewer, different, or additional components than depicted in FIG. 2. In still other implementations, one or more components of device 200 may perform one or more tasks described as being performed by one or more other components of device 200.

Exemplary Technical Computing Environments

Figure 3A:
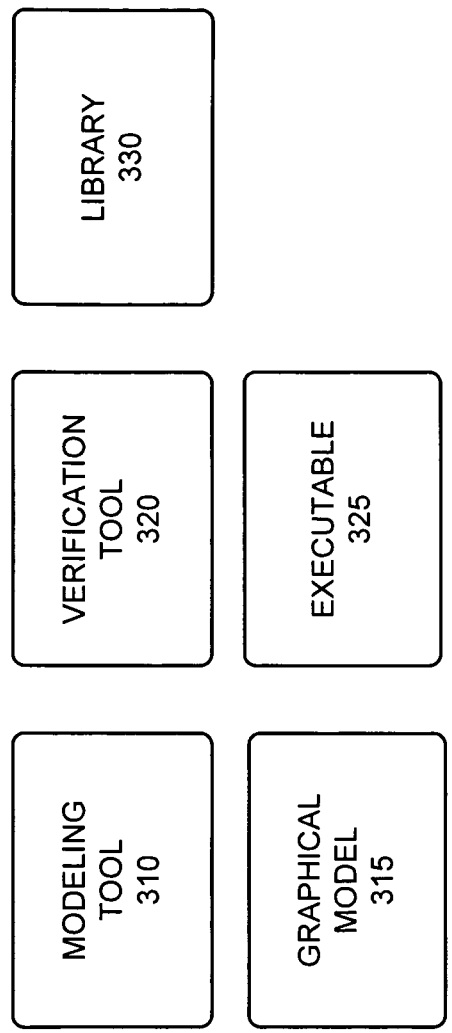
FIGS. 3A, 3B, and 3C are block diagrams of exemplary functional components of a technical computing environment in which embodiments described herein may be implemented.

FIG. 3A is a diagram of exemplary functional components of a TCE 300A in which embodiments described herein may be implemented. As illustrated, TCE 300A may include a modeling tool 310, a graphical model 315, a verification tool 320, an executable 325 form of graphical model 315, and a library 330. Modeling tool 310, graphical model 315, verification tool 320, executable 325, and library 330 may be stored in memory 230, ROM 240, and/or storage device 250 of device 200, for example, in one or more of workstations 110 or servers 120. TCE 300A may include more, fewer, or a different arrangement of functional components than shown in FIG. 3A. Moreover, modeling tool 310 may perform some of the functionality described as being performed by verification tool 320, and vice versa.

Modeling tool 310 may provide a model-based design environment. Modeling tool 310 may allow a user to create, edit, design, simulate, and/or test a model, such as model 315. Modeling tool 310 may include an automatic code building tool to generate source code from graphical model 315 and/or to generate executable 325 from graphical model 315.

Graphical model 315 may represent, for example, a design or algorithm for a control system, a signal processing system, a communication system, any other time-varying or dynamic system, any computational hardware device, or any software implementation. Graphical model 315 may include a block-diagram model, a state machine, a physical model, etc. As a block-diagram model, for example, graphical model 315 may include an arrangement of blocks representing different functionality and connected via lines representing signals traversing the blocks.

Library 330 may store functional blocks or elements for creating models, such as graphical model 315. The user of modeling tool 310 may access library 330, for example, to retrieve the functional blocks. The functional blocks and tools may be customizable and configurable by the user, for example. Library 330 may store, for example, an ADD block that may represent the function of adding two input values to produce a third sum value. Library 330 may also store multiplication blocks, subtraction blocks, logic blocks, etc. Library 330 may also store functional blocks that explicitly define exceptional behavior (e.g., unwanted behavior).

Executable 325 may be an executable form of graphical model 315 designed to run, for example, in verification tool 320. Executable 325 may contain instructions specific to the input format of verification tool 320. Alternatively, executable 325 may be generated to run on any microprocessor, such as processing unit 220, or on any abstract machine, real-time operating system, or other interpretive program. In one embodiment, executable 325 may be generated by the code building tool of modeling tool 310.

Verification tool 320 may include a verification environment for testing executable 325, which may be based on and/or derived from graphical model 315. Verification tool 320 may use formal methods to perform formal verification of executable 325. Verification tool 320 may verify executable 325 by any technique, such as bounded model techniques, symbolic model techniques, test generation techniques, solving techniques, theorem proving techniques, temporal logic techniques, exhaustive or deterministic techniques, or other mathematical or algorithm based techniques.

In one embodiment, verification tool 320 may identify dynamic occurrences of undesired behaviors of graphical model 315 as expressed in executable 325. For example, if graphical model 315 includes functional blocks from library 330 that explicitly define exceptional behavior, then testing may identify dynamic occurrences of these exceptional behaviors.

In one embodiment, modeling tool 310 and verification tool 320 may be combined into a single application, or otherwise integrated to present a single application in performing operations described herein. Additionally, although executable 325 is illustrated as external to modeling tool 310 and verification tool 320 in FIG. 3A, executable 325 may also reside in and/or execute in the environments of either modeling tool 310 and/or verification tool 320. For example, executable 325 may include an interpretative programming language that is executed in a run-time environment of either modeling tool 310 and/or verification tool 320.

Figure 3B:
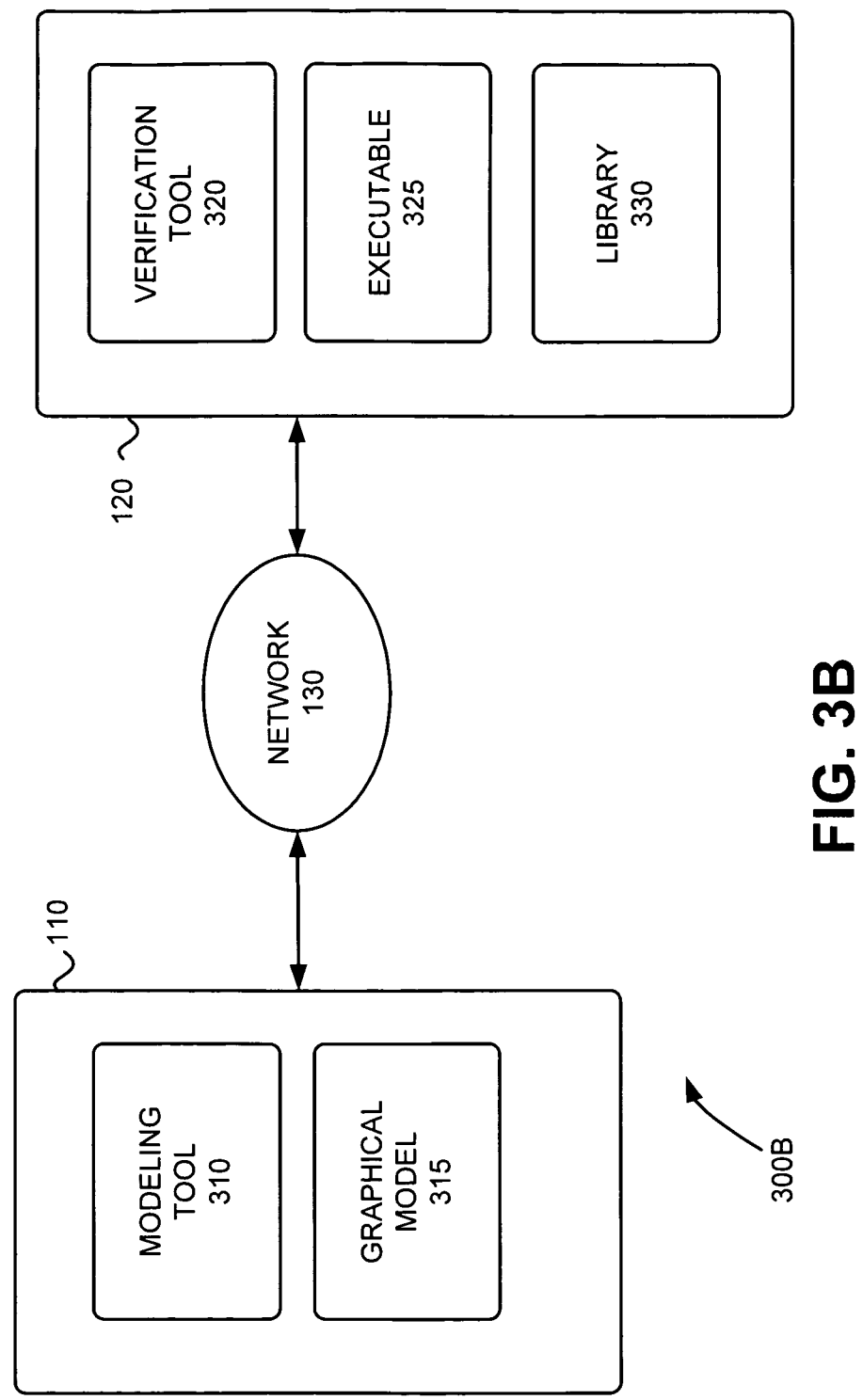

FIG. 3B is a block diagram of exemplary functional components of a TCE 300B in which embodiments described herein may be implemented. Like TCE 300A, TCE 300B may include modeling tool 310, graphical model 315, verification tool 320, executable 325, and library 330. TCE 300B, however, may also operate in a distributed manner, allowing portions of TCE 300B to run or be stored on multiple computing devices, such as workstations 110 and servers 120. In other words, workstations 110 and/or servers 120 may be capable of running any portion of TCE 300B. As shown in FIG. 3B, workstation 110 may, for example, store graphical model 315 and server 320 may store library 330. Further, modeling tool 310 may run in workstation 110, while verification tool 320 may run in server 120. As such, modeling tool 310 and verification tool 320 may run on a group of processing units of any of workstations 110 or servers 120.

Figure 3C:
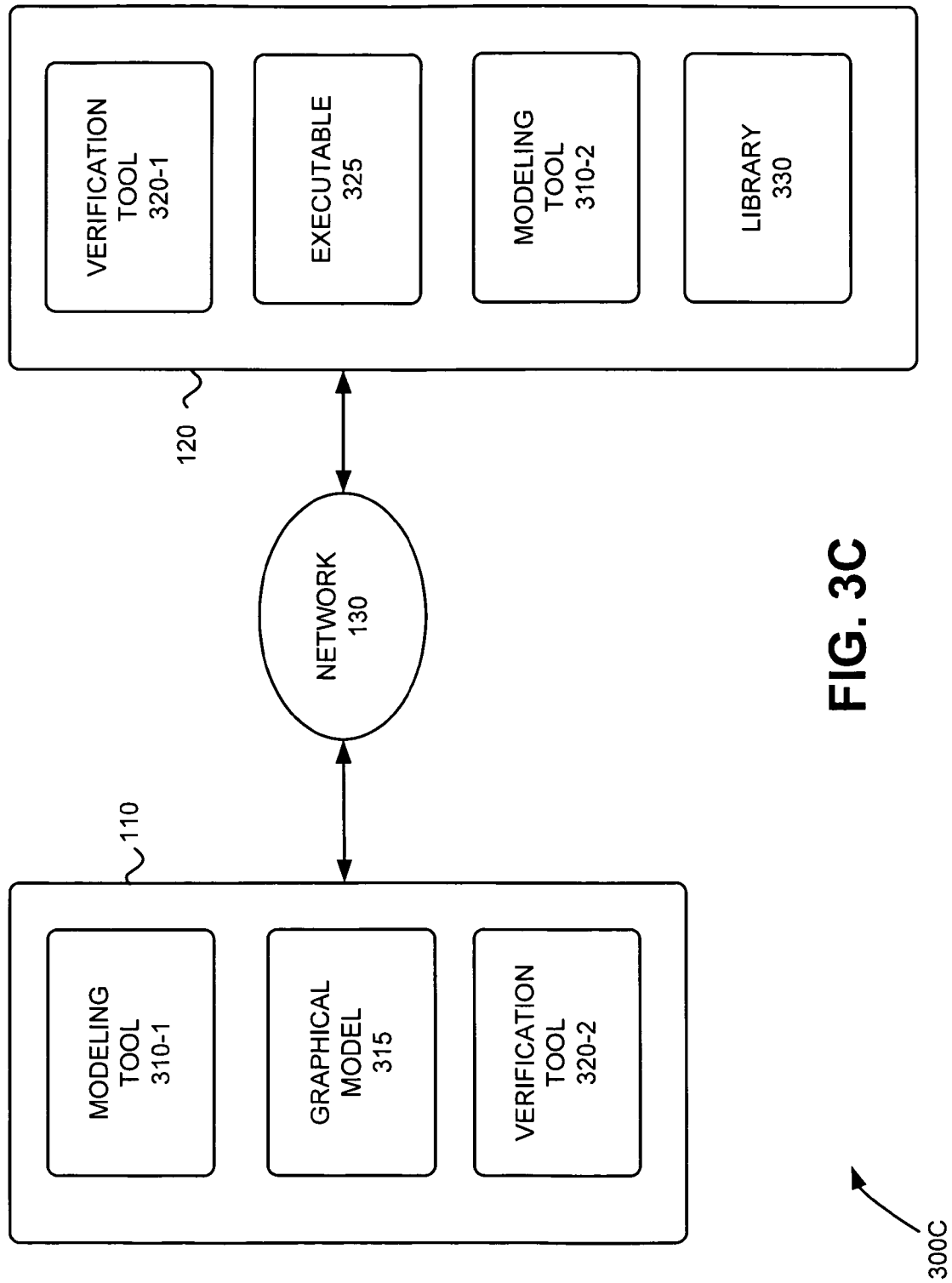

FIG. 3C is a block diagram of exemplary functional components of a TCE 300C in which embodiments described herein may be implemented. Like TCE 300A and TCE 300B, TCE 300C may include modeling tool 310, graphical model 315, verification tool 320, and library 330. Like TCE 300B, TCE 300C may operate in a distributed manner. As shown in FIG. 3C, modeling tool 310 and verification tool 320 may run on workstation 110. In addition, modeling tool 310 and verification tool 320 may also run in server 120.

As shown in FIG. 3C, modeling tool 310 and verification tool 320 may be capable of running in a client/server architecture. For example, modeling tool 310 may have a first portion 310-1 running on the workstation 110 and a second portion 310-2 running on server 120. First portion 310-1 may include a client portion for providing and displaying graphical model 315. Second portion 310-2 may include a server portion for providing application functionality and other processing, such as storing and/or retrieving portions of graphical model 315 from library 330. Likewise, verification tool 320 may also have a first portion 320-1 running in workstation 110 and a second portion 320-2 running in server 120.

As shown in FIGS. 3A, 3B, and 3C, modeling tool 310 and verification tool 320 may be deployed across a wide range of different technical computing environments.

Exemplary Model-Based Design and Exceptional Behavior

Figure 4:
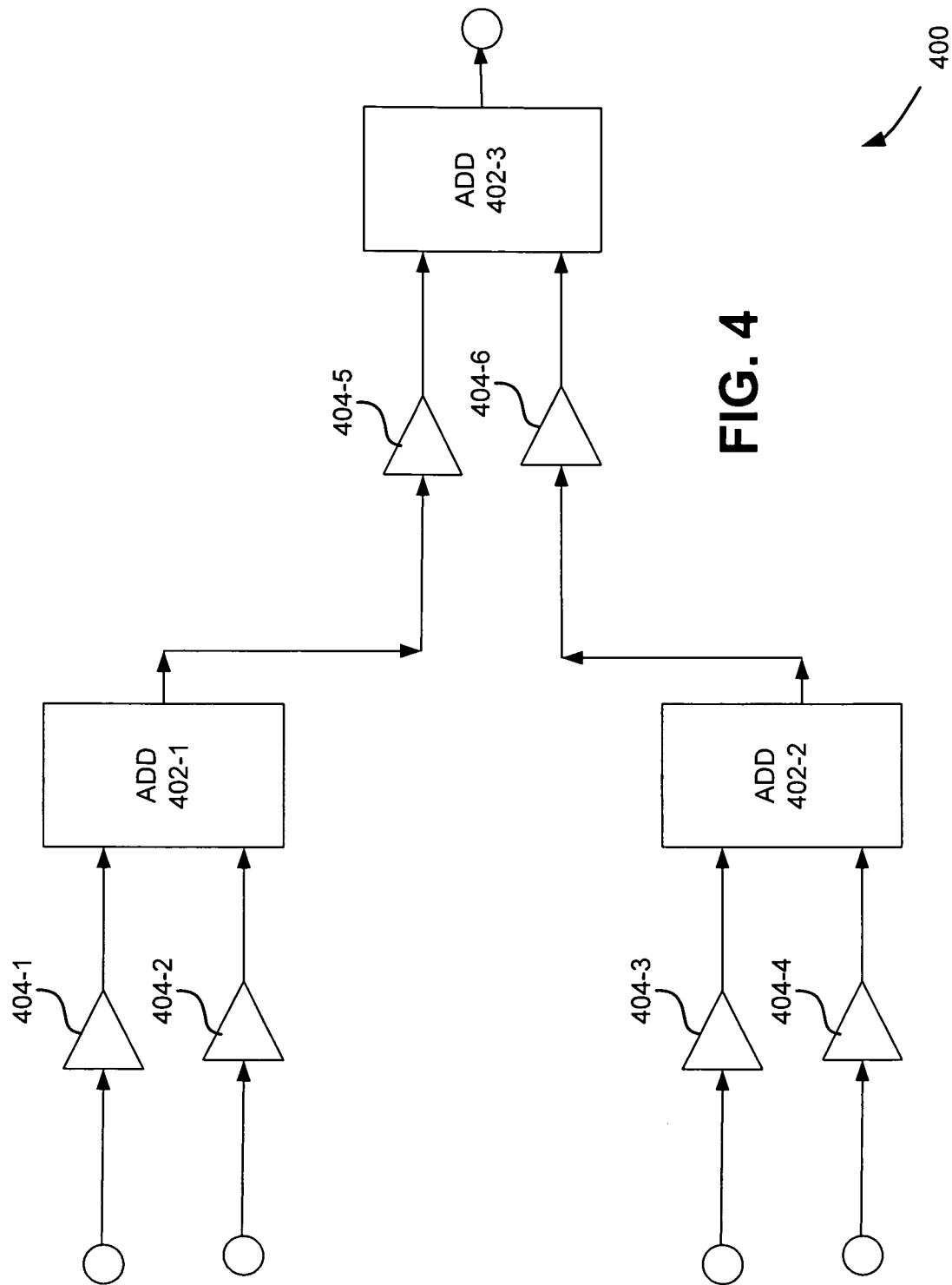
FIG. 4 is a block diagram of an exemplary model-based design.

FIG. 4 illustrates an exemplary graphical model-based design 400 for which techniques consistent with embodiments disclosed herein may be implemented. Design 400 may be stored in workstation 110 or server 120 as model 315, for example. Design 400 may include adders 402-1, 402-2, and 402-3 (collectively "adders 402"), and gains 404-1 though 404-6 (collectively "gains 404"). Design 400 may include additional, fewer, or a different arrangement of components. A user may have used modeling tool 310, for example, to retrieve the components, such as adders 402 and gains 404, from library 330 to generate design 400.

Adders 402 may receive two values as input and output the sum of the two inputted values, for example. Gains 404 may receive a value as input and may output a scaled value of the input. In the following example, adder 402 may have a fixed-point range for its inputs and outputs. Although design 400 is provided as a graphical specification, in another embodiment, design 400 may be provided as a textual specification of the design.

Design 400 may include an implicit danger that a computation could overflow the fixed-point range of the output of any one of adders 402. Such an overflow may lead to unexpected and undesired results. Such an unexpected or undesired result may be considered an exceptional behavior. In one embodiment, verification tool 320 may be used to detect such an exceptional behavior. In one embodiment, adders 402 may be replaced, or supplemented with a design element, to make the exceptional behavior explicit, e.g., to make the exceptional behavior detectable.

Figure 5:
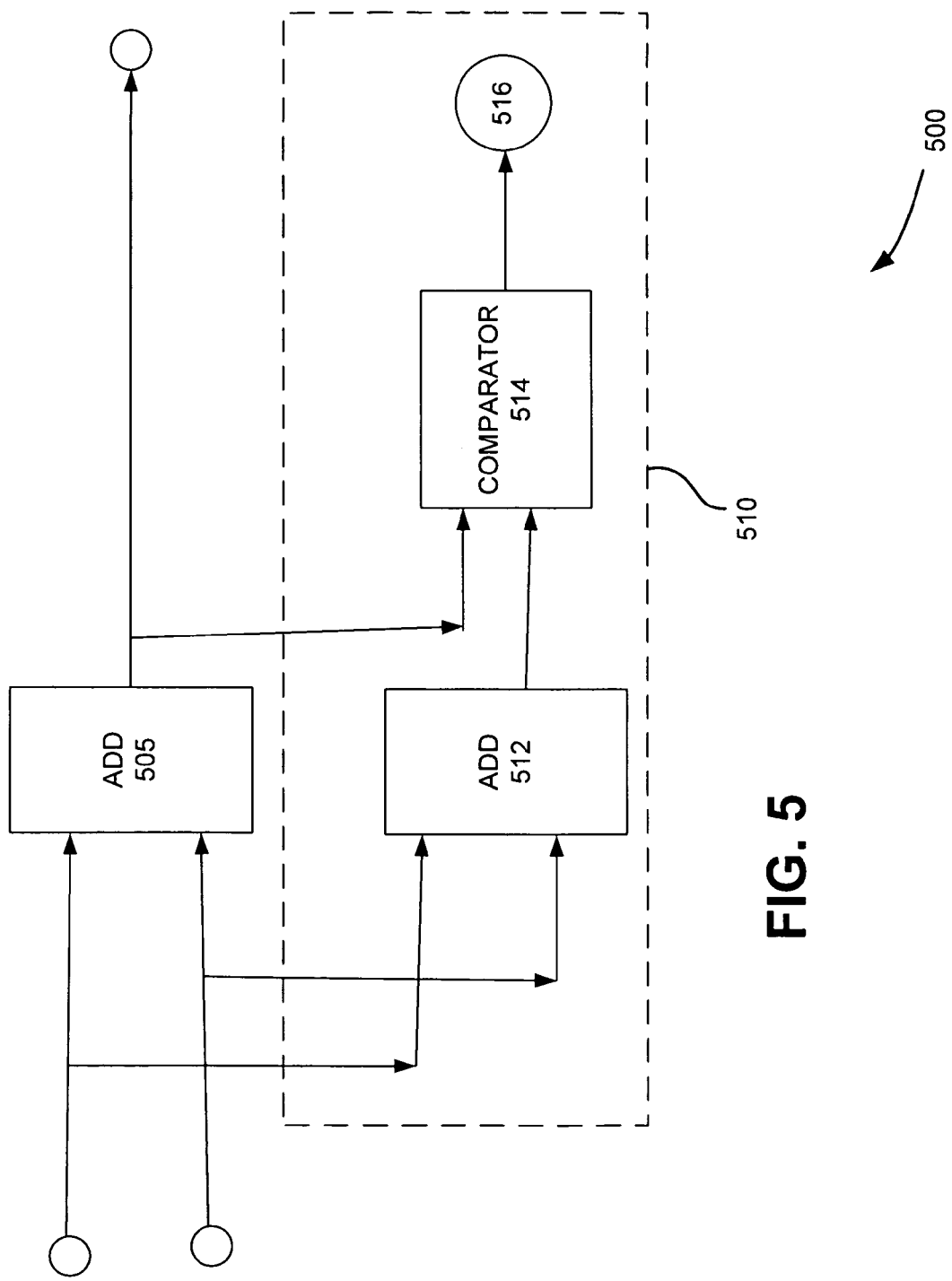
FIG. 5 is a block diagram of an exemplary replacement block including an exceptional design block.

FIG. 5 is a block diagram of an exemplary replacement add block 500 that may make the exceptional behavior of adder 402 explicit (e.g., making an overflow of the fixed-point range of the output explicit). Replacement add block 500 may be used, for example, as a replacement to add block 402 described above. A user may use modeling tool 310, for example, to retrieve the components from library 330 to generate replacement add block 500. In addition, the user may store replacement add block 500 in library 330.

Add block 500 may include an adder 505 and an exceptional behavior design element 510. Adder 505 may have the same function and characteristics as adders 402, including fixed-point input and output values. Thus, adder 505 may have the same exceptional behavior as adders 402, including the implicit danger that a computation could overflow the fixed-point range of the output.

Exceptional behavior design element 510 may make explicit (e.g., define, specify, or make detectable) an exceptional behavior associated with adder 505. In this example, design element 510 may make explicit the implicit danger that a computation could overflow the fixed-point range of adder 505.

Design element 510 may include an adder 512, a comparator 514, and a proof objective 516. Adder 512, like adder 505, may receive two values as input and may output the sum of the two values. Adder 512, however, may have a greater fixed-point range for its output than adder 505 (and, thus, adders 402) and may maintain the same resolution, e.g., the same numerical significance for the last bit, e.g., least significant bit. As shown in FIG. 5, design element 510 may be configured such that adder 512 receives the same two input values as adder 505. One would expect, therefore, that adder 512 may output the same value as adder 505 under normal execution.

In one embodiment, the exceptional behavior may be made explicit by expanding the computational capability of the exceptional behavior design element beyond the native capability of the target environment. For example, if the target environment is capable of natively operating on 32 bit inputs and outputs (e.g., one word at a time), then it may be desirable to define the exceptional behavior using two words to represent inputs and outputs. In one embodiment, the exceptional behavior may be defined differently based on native capabilities of the target environment. For example, the definition of the exceptional behavior for adder 402 may be different depending on whether the target environment includes an 8-bit, 16-bit, 32-bit, or 64-bit processor.

Comparator 514 may receive two values as inputs and may output a Boolean value. Comparator 514 may output TRUE when the two input values are the same, and FALSE when the two input values are different. As shown in FIG. 5, design element 510 may be configured to input the output value of adder 505 and the output value of adder 512. As noted above, one may expect the output of adders 505 and 512 to be the same, indicating that the output of comparator 514 would always be TRUE. As also indicated above, however, it is possible that the exceptional behavior of adder 505 may result in an unexpected output. For example, when a computation overflows the fixed-point range of adder 505, the output of adder 505 may be different than the output of adder 512 because adder 512 includes a greater fixed-point range. Thus, if comparator 514 outputs FALSE, this may indicate the exceptional behavior, e.g., an overflow of the fixed-point range of adder 505.

Proof objective 516 may specify a goal for analysis by verification tool 320. Proof objective 516 may indicate to verification tool 320 the state of design element 510 when the exceptional behavior occurs. For example, proof objective 516 may indicate that an exceptional behavior has occurred in adder 505 when the output of comparator 514 is FALSE.

In one embodiment, design element 510 may not affect the behavior of adder 505. That is, although design element 510 may detect the exceptional behavior of adder 505, it may deliberately not prevent it.

Figure 6A:
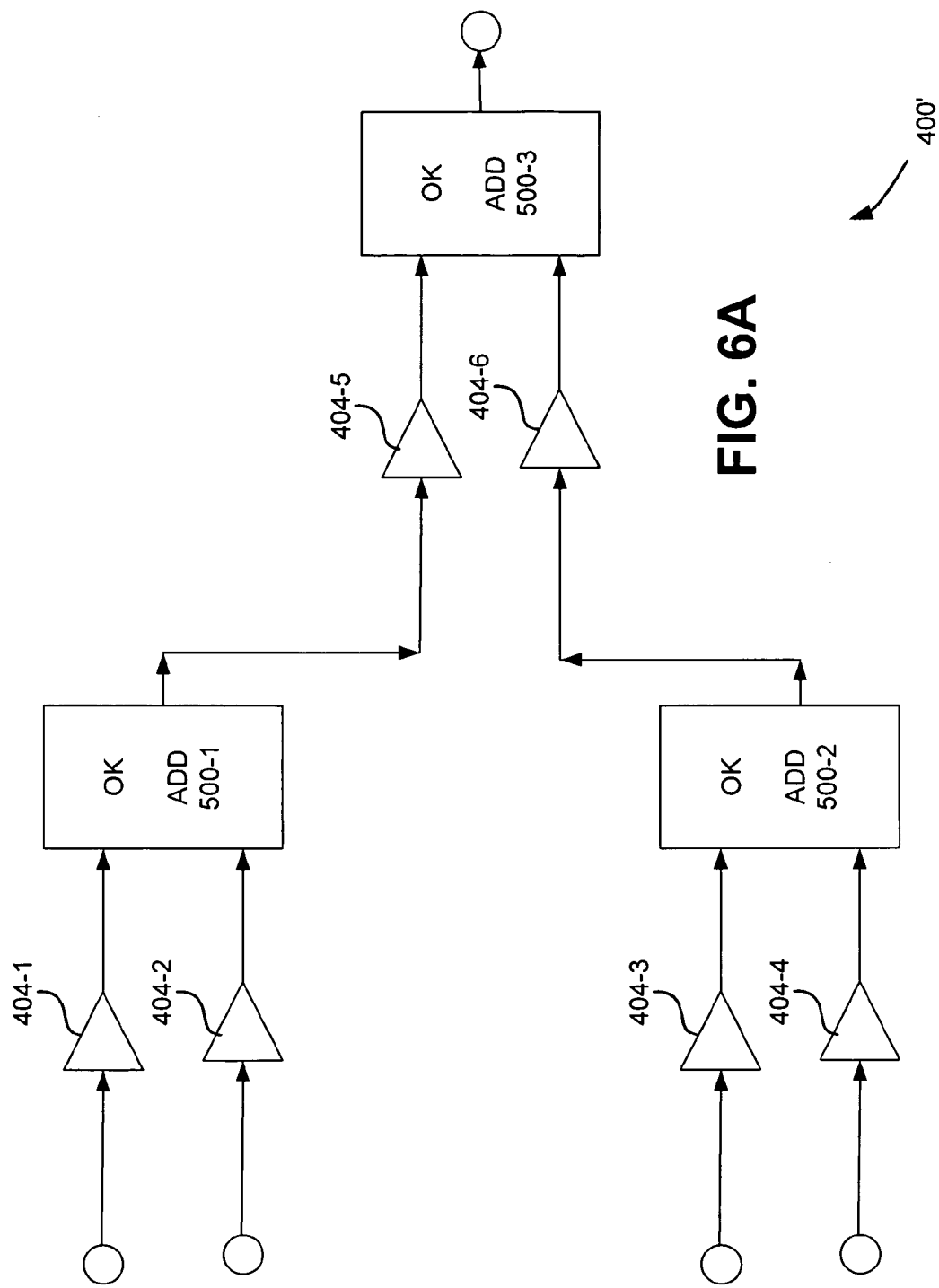
FIGS. 6A and 6B are block diagrams of the model-based design of FIG. 4 with explicit exceptional behavior.

As indicated above, adders 402 in design 400 may be replaced to make the exceptional behavior explicit. For example, each instance of adder 402 in design 400 may be replaced with replacement add block 500. FIG. 6A is a block diagram of a model-based design 400' including replacement adders. FIG. 6A is similar to FIG. 4, but each of adders 402-1, 402-2, and 402-3 has been replaced with replacement add block 500, e.g., adder 500-1, 500-2, and 500-3 (collectively "adders 500"), respectively.

In FIG. 6A, adders 500 may be graphically different than adders 402 to distinguish them for a user. For example, adders 500 may include an OK label. Other ways of visually distinguishing replacement blocks in a model may be used. Replacement blocks 500 may, therefore, indicate that exceptional design element 510 has been provided. In one embodiment, replacing add blocks 402 with replacement blocks 500 may be considered modifying model-based design 400 to generate modified model-based design 400'.

Figure 6B:
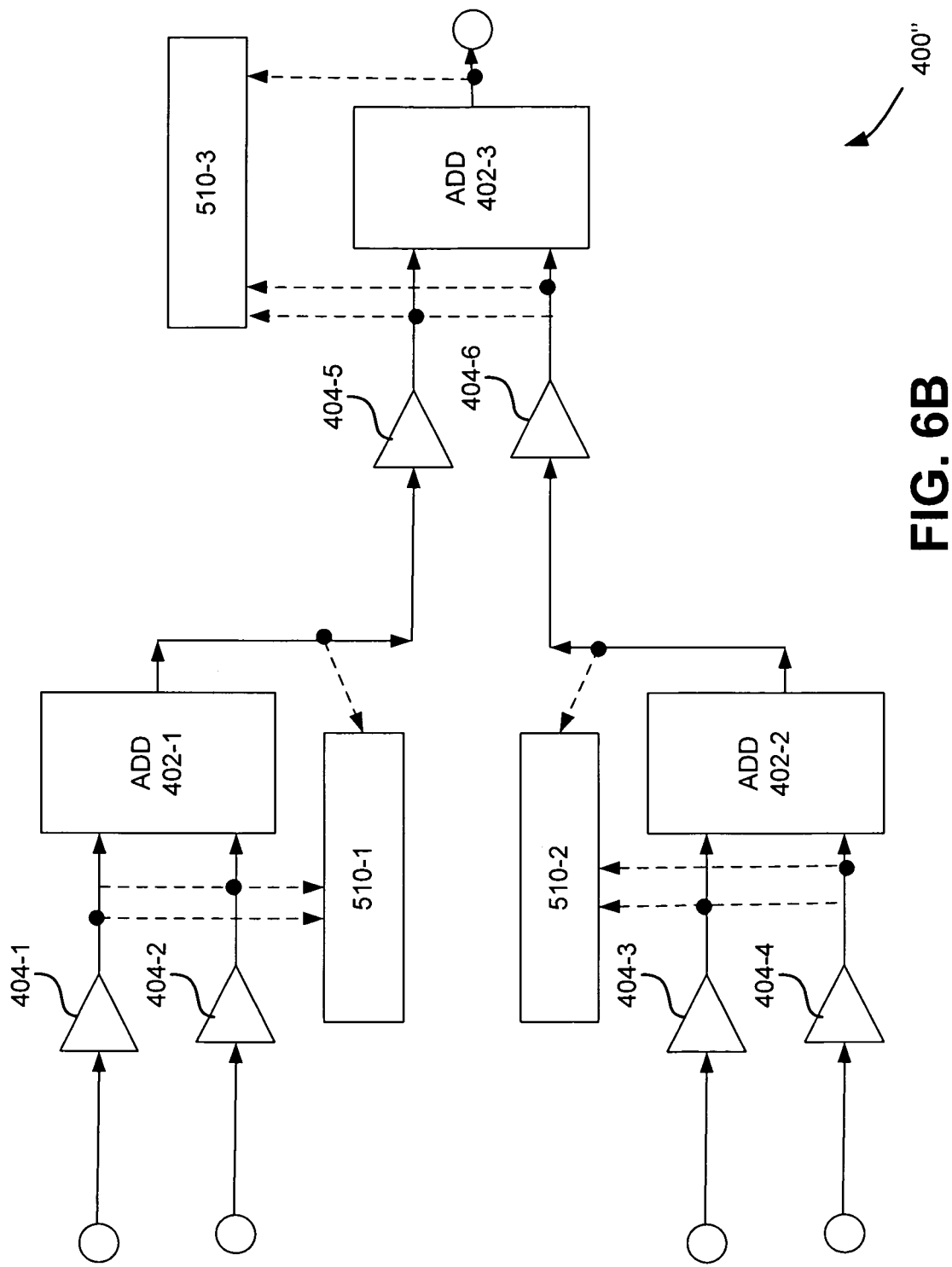

As also indicated above, adders 402 in design 400 may alternatively be supplemented with a design element in model 400 to make the exceptional behavior explicit. For example, each instance of adder 402 in design 400 may be supplemented (e.g., modified) with exceptional behavior design element 510. FIG. 6B is a block diagram of a model-based design 400" including design element 510. As shown in FIG. 6B, each adder 402-1, 402-2, and 402-3 may be associated design elements 510-1, 510-2, and 510-3, respectively.

As shown above, designs 400' and 400" may include explicit definitions of exceptional behavior for formal analysis by verification tool 320. Verification tool 320 may input designs 400' and 400" to exhaustively test for exceptional behaviors, for example. Alternatively or additionally, elements in design 400 (e.g., adders 402 or gains 404) may themselves include or be associated with explicit definitions of exceptional behavior and, therefore, design 400 may also include explicit definitions of exceptional behavior for formal analysis by verification tool 320.

Design block 510 makes explicit one type of exceptional behavior, (e.g., a fixed point range overflow). Other exceptional behaviors may also be made explicit. For example, an exceptional behavior may be any undesired state, performance, or behavior of a design. Exceptional behaviors may also include an overflow, an underflow, a divide by zero, a default state, a singular matrix, a violation of a design assumption, out-of-bounds indexing, unused bits, a failed state, an input not defined in an enumerated-input set, a domain error (e.g., arc sine of 5), a range error (e.g., square root of −1), a partial precision loss (floating point), a denormal number or a gradual-partial underflow (floating point), or an input/output not a number error.

Design element 510 makes an exceptional behavior explicit by using a graphical model-based design. Exceptional behaviors and corresponding design elements may be made explicit using any type of graphical or textual expression. In addition, design 400 uses a graphical model-based design. Other designs may use any type of graphical or textual expressions. Whether a design or design element is graphical, textual, or a hybrid, functional blocks or elements (such as add blocks 402, 505, and 512, and multiplication blocks 404), may be considered language constructs.

As indicated above, an exceptional behavior design element may not affect the behavior of the model-based design being verified. For example, design element 510 may not affect the behavior of adder 505. That is, although design element 510 may detect the exceptional behavior of adder 505, it may deliberately not prevent it. In one embodiment, exceptional behavior design elements may include an active/inactive switch so that a user may turn on or off the functionality provided by the design element. Turning off the exceptional behavior design element may be desirable, for example, when verification is complete or when verification is being performed on a different portion of the model-based design.

A collection of exceptional behavior design elements and replacement blocks, such as design element 510 and replacement add block 500, may be stored in library 330. Library 330 may also associate exceptional behavior design elements and replacement blocks with the design elements for which they replace or make the exceptional behavior explicit. For example, library 330 may associate both design element 510 and replacement block 500 with add block 402. A user of modeling tool 310 may access the collection of exceptional behavior design elements for incorporation into a design. The user may also reconfigure or alter selected exceptional behavior design elements.

Exemplary Processing

FIG. 7 is a flowchart of an exemplary process 700 for making an exceptional behavior explicit in a model-based design and verifying the model based design. Process 700 may be performed, for example, by one or more of workstations 110 and/or servers 120 in any of TCEs described in FIGS. 3A through 3C.

Processing may begin with a design specification being received (block 705). The design specification may include, for example, model-based design 400 described above with respect to FIG. 4. For example, modeling tool 310 may receive model-based design 400 from. The received design specification, like design 400, may include elements (e.g., language constructs) that have exceptional behaviors. The design specification may include a textual, graphical, or hybrid representation, for example.

An identification of an explicit exceptional behavior ("explicit behavior identification" or "behavior identification") may be received (block 710). The behavior identification may include an exceptional behavior design element, such as design element 510. The behavior identification may also include a replacement block, such as replacement add block 500. The behavior identification may include a textual, graphical, or hybrid representation.

Modeling tool 310 may receive the behavior identification from the user. For example, the user may identify and select a replacement block from the collection of replacement blocks stored in library 330. The user may also associate the selected replacement block with the corresponding element in the design specification with the exceptional behavior. For example, a user may associate replacement block 500 with add blocks 402 of model-based design 400. The user may also identify and select an exceptional behavior design element from the collection of design elements stored in library 330. In this case, the user may associate the selected exceptional behavior design element with the corresponding element in the design specification with the exceptional behavior. For example, a user may associate exceptional design element 510 with add blocks 402 of model-based design 400.

Alternatively, the behavior identification may be determined (and received) automatically by modeling tool 310. Modeling tool 310 may identify elements in the received design specification (from block 705) that have exceptional behaviors. Modeling tool 310 may automatically identify replacement blocks, for example, that correspond to the elements in the received design specification with exceptional behaviors.

The design specification may be searched (block 715). The received design specification (from block 705) may be searched to identify instances of elements (e.g., language constructs) that correspond to or have been associated with the received behavior identification. For example, if the user identified replacement add block 500 as the behavior identification, modeling tool 310 may search design specification 400 to identify instances of add block 402.

The design specification may be modified and the exceptional behavior may be made explicit (block 720). The identified elements (e.g., language constructs) of the design specification with the exceptional behavior may be replaced or supplemented to make the exceptional behavior explicit. For example, modeling tool 310 may replace instances of add block 402 (e.g., modify design 400) with instances of replacement add block 500. Alternatively, modeling tool 310 may supplement instances of add block 402 with design element 510. In one embodiment, the modification of the design specification may depend on factors such as the capability of the target environment. For example, the modification may depend on the native computation capability of the target environment, e.g., an 8-bit environment, a 16-bit environment, etc. In situations where the target environment is mixed (e.g., some portions of the design specification operating in an 8-bit environment and other parts operating in a 16-bit environment), exceptional behavior may be defined differently for different parts of the design specification. In this mixed environment situation, identified elements may be replaced or supplemented based on the target environment for that identified element, for example.

An executable may be generated based on the design specification with explicit exceptional behavior (block 725). Modeling tool 310, for example, may generate the executable based on the design specification with explicit exceptional behavior. For example, graphical modeling tool 320 may generate the executable from model-based design 400' or 400", both of which include an explicit definition of exceptional behavior. In one embodiment, elements in design 400 (e.g., adders 402 or gains 404) may additionally or alternatively include explicit definitions of exceptional behavior. In this embodiment, graphical modeling tool 320 may generate the executable from model-based design 400, for example.

The design specification with explicit exceptional behavior may be analyzed for dynamic occurrences of explicit exceptional behavior (block 730). For example, verification tool 320 may receive the executable (generated at block 725)

that represents model-based design 400', which includes explicit exceptional behavior. Verification tool 320 may interpret proof objective 516 and simulate model-based design 400' to determine whether proof objective 516 can be established. For example, verification tool 320 may simulate every possible input to determine whether the output of comparator 514 will always be TRUE, indicating no occurrences of the exceptional behavior, or FALSE, indicating an occurrence of the exceptional behavior.

The results of verification may be generated (block 735). If verification tool 320 finds no occurrences of the exceptional behavior, then it may inform the user of the outcome. If verification tool 320 determines an occurrence of the exceptional behavior, then verification tool 320 may generate a counter example to proof objective 516, e.g., verification tool 320 may provide the inputs and outputs that caused the exceptional behavior. If verification tool 320 does not establish proof objective 516 (e.g., the output of comparator 514 may be FALSE), then verification tool 320 may specify the inputs to design 400' that resulted in comparator 514 outputting FALSE. On the other hand, if verification tool 320 establishes proof objective 516 (e.g., the output of comparator 514 is always TRUE), then verification tool 320 may indicate so to the user. In one embodiment, verification tool 320 may highlight the design element in the received design specification, for example, to indicate where in the specification the exceptional behavior occurred.

Figure 8:
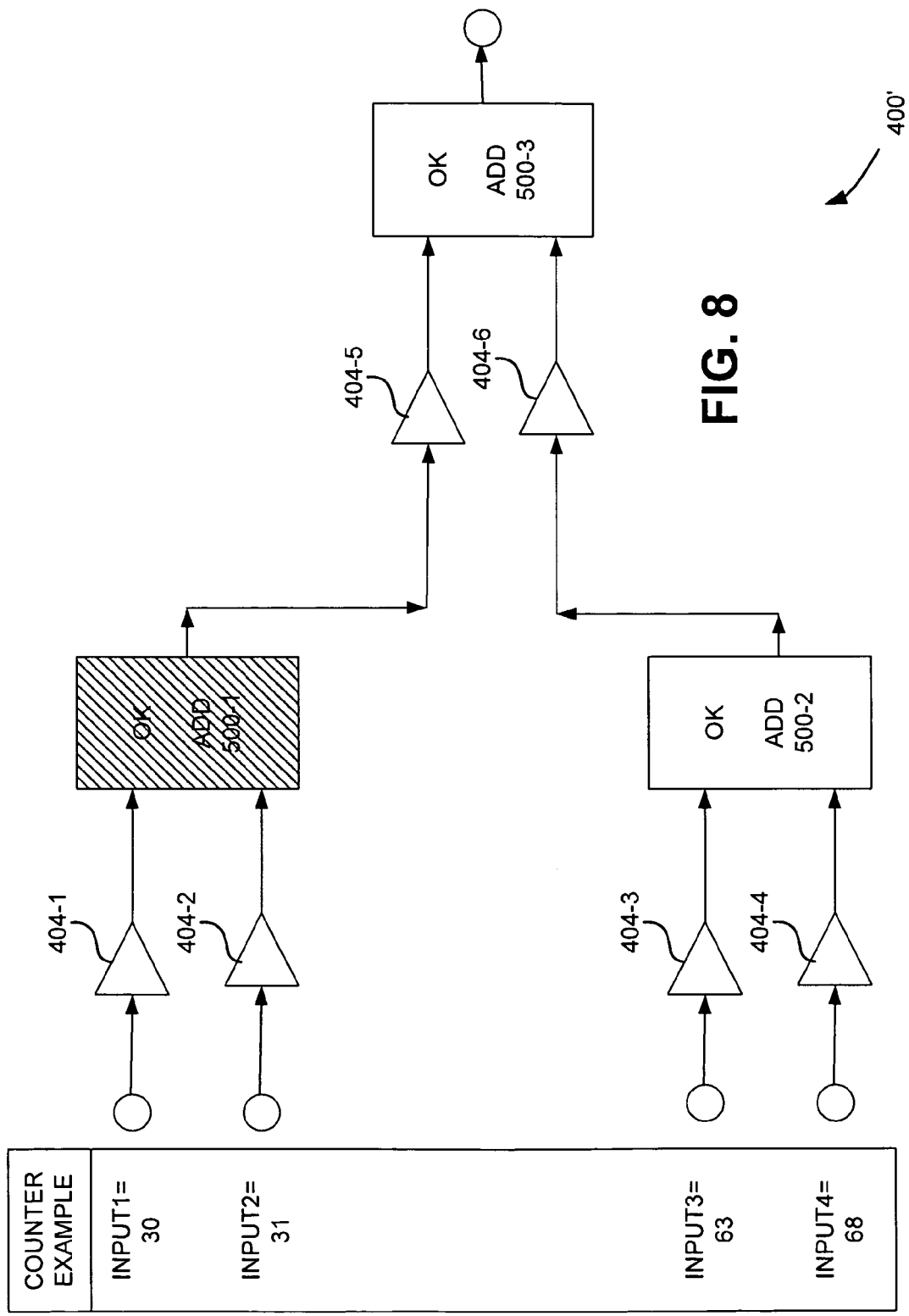
FIG. 8 is a block diagram of an exemplary counter example output from a verification tool.

FIG. 8 is a block diagram of a counter example output from verification tool 320. FIG. 8 shows that design 400' was tested for exceptional behavior. As shown in FIG. 8, add block 500-1 may be highlighted to indicate that an exceptional behavior occurred, e.g., that proof objective 516 was not established. Verification tool 320 may provide a counter example to proof objective 516, e.g., the state where proof objective 516 failed. The counter example, as shown, includes the inputs to design 400' when the exceptional behavior occurred. The inputs are shown as INPUT1, INPUT2, INPUT3, and INPUT4 of 30, 31, 63, and 68, respectively.

U.S. patent application Ser. No. 11/096,528, titled "TEST PRECONDITION ITEMS FOR AUTOMATED ANALYSIS AND TEST GENERATION," filed Mar. 31, 2005, is hereby incorporated by reference.

CONCLUSION

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

While series of blocks have been described above, such as with respect to FIG. 7, the order of the blocks may differ in other implementations. Moreover, non-dependent blocks may be implemented in parallel.

It will be apparent that aspects of the embodiments, as described above, may be implemented in many different forms of software, firmware, and hardware in the implementations illustrated in the figures. The actual software code or specialized control hardware used to implement these embodiments is not limiting of the invention. Thus, the operation and behavior of the embodiments of the invention were described without reference to the specific software code—it being understood that software and control hardware may be designed to the embodiments based on the description herein.

Further, certain portions of the invention may be implemented as "logic" that performs one or more functions. This logic may include hardware, such as an application specific integrated circuit, a field programmable gate array, a processor, or a microprocessor, or a combination of hardware and software.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. One or more non-transitory computer-readable media storing instructions, the instructions comprising:
   one or more instructions, executable by at least one processor, to:
   receive a design specification that includes a graphical model-based design,
      the graphical model-based design including an instance of a first graphical block,
      the first graphical block being associated with an implicit occurrence of an exceptional behavior when the first graphical block is executed;
   identify, in the design specification, the instance of the first graphical block;
   modify, based on identifying the instance of the first graphical block, the design specification to generate a modified design specification by inserting a design element into the design specification,
      the modified design specification including the design element and the first graphical block,
      the design element representing a same function as the first graphical block and having a different computational capability than the first graphical block, and
      the design element receiving a same set of inputs as the first graphical block;
   analyze the modified design specification to determine an output of the design element based on the different computational capability of the design element and the same set of inputs,
      the output of the design element making the implicit occurrence of the exceptional behavior explicit; and
   detect an occurrence of the exceptional behavior when the first graphical block is analyzed based on the output of the design element making the implicit occurrence of the exceptional behavior explicit.

2. The one or more non-transitory computer-readable media of claim 1, where the one or more instructions to detect the occurrence of the exceptional behavior include:
   one or more instructions to determine an occurrence of one or more of:
      an overflow,
      an underflow,
      a divide by zero,
      a default state,
      a singular matrix,
      a violation of a design assumption associated with the design specification,
      out-of-bounds indexing, unused bits,
a failed state,
an input that is not defined in an enumerated-input set,
a domain error,
a range error,
a partial precision loss,
a gradual-partial underflow, or
an input/output that is not a number error.

3. The one or more non-transitory computer-readable media of claim 1, where the design element includes a second graphical block and a third graphical block,
the second graphical block representing the same function as the first graphical block and having the different computational capability than the first graphical block,
the third graphical block comparing the output of the first graphical block and an output of the second graphical block and enabling the occurrence of the exceptional behavior to be made explicit.

4. The one or more non-transitory computer-readable media of claim 1, where the first graphical block performs a first computation, and
where the design element performs a second computation having a greater range than the first computation.

5. The one or more non-transitory computer-readable media of claim 4, where the first computation includes a first fixed-point computation and the second computation includes the first fixed-point computation with the greater range, or
where the first computation includes a first floating-point computation and the second computation includes the first floating-point computation with the greater range.

6. The one or more non-transitory computer-readable media of claim 1, where the one or more instructions to modify the design specification include:
one or more instructions to replace the instance of the first graphical block with a replacement block,
the replacement block including the first graphical block and the design element.

7. A method comprising:
receiving a design specification that includes a graphical model-based design,
the graphical model-based design including an instance of a first graphical block that is associated with an implicit occurrence of an exceptional behavior when the first graphical block is executed,
the receiving the design specification being performed by a device;
identifying, in the design specification, the instance of the first graphical block,
the identifying the instance being performed by the device;
applying, based on identifying the instance of the first graphical block, a modification to the design specification by inserting an element into the design specification to generate a modified design specification,
the modified design specification including the element and the first graphical block,
the element representing a same function as the first graphical block and having a different computational capability than the first graphical block,
the element receiving a same set of inputs as the first graphical block,
the applying the modification being performed by the device;
analyzing the modified design specification to determine an output of the element based on the different computational capability of the element and the same set of inputs,
the output of the element making explicit the implicit occurrence of the exceptional behavior,
the output of the element being different than an output of the first graphical block when analyzed,
the analyzing the modified design specification being performed by the device; and
detecting an occurrence of the exceptional behavior during execution of the modified design specification based on the output of the element,
the detecting being performed by the device.

8. The method of claim 7, where the exceptional behavior includes one or more of:
an overflow,
an underflow,
a divide by zero,
a default state,
a singular matrix,
a violation of a design assumption,
out-of-bounds indexing,
unused bits,
a failed state,
an input not defined in an enumerated-input set,
a domain error,
a range error,
a partial precision loss,
a gradual-partial underflow, or
an input/output that is not a number error.

9. The method of claim 7, where applying the modification includes:
adding a second graphical block to the design specification,
the second graphical block comparing the output of the first graphical block and an output of the element and enabling the occurrence of the exceptional behavior to be made explicit.

10. The method of claim 7, where the first graphical block performs a first computation having a first range and the element performs a second computation having a second range that is greater than the first range.

11. The method of claim 10, where the first computation includes a first fixed-point computation and the second computation includes the first fixed-point computation with the second range that is greater than the first range, or
where the first computation includes a first floating-point computation and the second computation includes the first floating-point computation with the second range that is greater than the first range.

12. A system comprising:
a memory to store:
a graphical model including a first graphical block,
the first graphical block being associated with an implicit occurrence of an exceptional behavior when the first graphical block is executed; and
one or more processors to:
identify, in the graphical model, an instance of the first graphical block,
apply, based on identifying the instance of the first graphical block, a modification to the graphical model, to form a modified graphical model, by inserting a design element into the graphical model,
the modified graphical model including the design element and the first graphical block, applying the modification generating a modified graphical model,
the design element representing a same function as the first graphical block and having a different computational capability than the first graphical block, and
the design element receiving a same set of inputs as the first graphical block;
analyze the modified graphical model to determine an output of the design element based on the different computational capability of the design element and the same set of inputs,
the output of the design element making the implicit occurrence of the exceptional behavior explicit; and
detect an occurrence of the exceptional behavior when the first graphical block is analyzed based on the output of the design element making the implicit occurrence of the exceptional behavior explicit.

13. The system of claim 12, where the exceptional behavior includes one or more of:
an overflow,
an underflow,
a divide by zero,
a default state,
a singular matrix,
a violation of a design assumption,
out-of-bounds indexing,
unused bits,
a failed state,
an input not defined in an enumerated-input set,
a domain error,
a range error,
a partial precision loss,
a gradual-partial underflow, or
an input/output not a number error.

14. The system of claim 12, where the first graphical block performs a first computation, and
where the design element performs a second computation having a greater range than the first computation.

15. The system of claim 14, where the first computation includes a first fixed-point computation and the second computation includes the first fixed-point computation with the greater range, or
where the first computation includes a first floating-point computation and the second computation includes the first floating-point computation with the greater range.

16. The system of claim 12, where, when applying the modification, the one or more processors are further to:
replace the instance of the first graphical block with a replacement block,
the replacement block including the first graphical block and the design element.

17. The one or more non-transitory computer-readable media of claim 1, where the instructions further comprise:
one or more instructions to determine a computational capability of a target environment for an execution of the design specification, and
where the one or more instructions to modify the design specification include:
one or more instructions to use the design element to expand a computational capability of the first graphical block beyond the computational capability of the target environment.

18. The one or more non-transitory computer-readable media of claim 1, where a target environment for an execution of the design specification has a particular native capability, and
where the one or more instructions to modify the design specification include:
one or more instructions to define the exceptional behavior to exceed the particular native capability.

19. The one or more non-transitory computer-readable media of claim 1, where the first graphical block comprises an adder block and the design element includes one or more comparator blocks that output a Boolean value based on an output of the first graphical block.

20. The method of claim 7, where the first graphical block comprises an adder block and the element includes one or more comparator blocks that output a Boolean value based on the output of the first graphical block.

* * * * *